United States Patent [19]

Bensahel et al.

[11] 4,263,056

[45] Apr. 21, 1981

[54] METHOD FOR THE MANUFACTURE OF LIGHT EMITTING AND/OR PHOTODETECTIVE DIODES

[75] Inventors: Daniel Bensahel; Jean Marine; Bernard Schaub, all of Grenoble, France

[73] Assignee: Commissariat a l'Energie Atomique, Paris, France

[21] Appl. No.: 42,081

[22] Filed: May 24, 1979

[30] Foreign Application Priority Data

Jun. 12, 1978 [FR] France ............... 78 18033

[51] Int. Cl.³ .................. H01L 7/02; H01L 21/265
[52] U.S. Cl. .................. 148/1.5; 148/175; 357/30
[58] Field of Search ............ 148/175, 1.5; 357/30

[56] References Cited

U.S. PATENT DOCUMENTS 3,551,763 12/1970 Hakki ............................. 317/237
3,732,471 5/1973 Hov et al. ...................... 317/234 R

OTHER PUBLICATIONS

Parker et al., "Prep. . . . of $Mg_xZn_{1-x}Te$", J. Electrochem. Soc. 118, (1971), 979.

Pautrat et al., "Ion Implantation in ZnTe . . . ", Radiation Effects, 30 (1976), 107.

Baker et al., "Schottky Barriers on ZnTe", J. Appl. Phys. 43, (1972), 5152.

*Primary Examiner*—L. Dewayne Rutledge
*Assistant Examiner*—Upendra Roy
*Attorney, Agent, or Firm*—Thomas R. Boland

[57] ABSTRACT

Method for the manufacture of light emitting and/or photodetective diodes, wherein it comprises the following operations:
(a) starting with a substrate of the material $Mg_xZn_{1-x}Te$;
(b) a means which will make this material conductive is applied thereto;
(c) a layer of thickness $x_j$ is applied to the surface of this substrate and which is compensated in such a way that it has a high resistivity;
(d) ions are implanted with a sufficient energy to create a trapping zone of thickness $x_1$ in the semiconductor surface and above it an insulating zone of thickness $x_2$ with $x_1 < x_j$;
(e) conductive contacts are formed on the substrate surface and on its second face.

Light emitting and/or photodetective diodes and diode matrixes obtained by this method.

11 Claims, No Drawings

METHOD FOR THE MANUFACTURE OF LIGHT EMITTING AND/OR PHOTODETECTIVE DIODES

BACKGROUND OF THE INVENTION

The present invention relates to a method for the manufacture of diodes which have light emitting and detecting properties. More specifically these diodes are able to emit light with a clearly defined wavelength when an adequate electrical voltage is applied thereto or can form the source of a current when subject to the action of light radiation. Certain of the diodes manufactured according to this method can have both of these properties at the same time.

More specifically the invention relates to diodes having these two types of properties and which are manufactured from a composite semiconductor material.

Light emitting diodes are already known which are constructed by ion implantation in a semiconductor substrate of zinc telluride ZnTe. The operation of such diodes has been described by Pfister and Marine in Acta Electronica 1976, page 166.

With the aim of improving the properties of such diodes and in particular to increase their emission and reception efficiencies and to give them the capacity of operating in either emission or reception as required, an improved method for the manufacture of diodes by ion implantation has been developed and is covered by French Patent Application EN 78 08522 of Mar. 23, 1978 in the name of the Commissariat à l'Energie Atomique. The improved method of this French application is essentially characterised by producing a compensated layer having a high resistivity in the ZnTe plate surface prior to ion implantation. This layer is more particularly obtained by thermal diffusion of the constituent atoms of a conductor deposit covering the semiconductor plate.

However, said diodes produced by ion implantation in zinc telluride have a number of shortcomings:

The emission wavelength is limited and, as the band gap of ZnTe is 2.3 eV, it is not possible to obtain a higher energy emission, e.g. a blue luminescence.

The spectral reception region is limited to the band of 2.3 to 2.82 eV, also fixed by the band gap of ZnTe.

In particular, in emission, these diodes have a large number of black lines indicating the presence of dislocations in the starting material, said dislocation lines being non-radiative recombination zones which enlarge with time. Furthermore, at the end of a few hours operation the non-radiative zones cover the entire surface and finish up by making the diode very inefficient in emission.

BRIEF SUMMARY OF THE INVENTION

The present invention relates to a method for the manufacture of light emitting and/or photodetective diodes obviating the above disadvantages.

This invention is based on the following findings observed during testing with a large number of samples. The crystalline quality of samples of the ternary alloy $Mg_xZn_{1-x}Te$ is systematically better than that of ZnTe samples. It has been found that a small proportion of magnesium is sufficient to decrease in a spectacular manner the number of crystal dislocations. For example, a $Mg_xZn_{1-x}Te$ crystal in which $x=0.08$ is virtually without defects. When x increases this effect is retained and the band gap of the semiconductor widens. These experimental results led the Inventors to study a method for the manufacture of diodes from the alloy $Mg_xZn_{1-x}Te$. A priori, it appeared that the diodes obtained would have a considerably increased service life, that their emission wavelength would be modified and could, in particular, be located in the blue which is very difficult to obtain with no materials, and that it could be adjusted to a given value in the spectral region comprising the green and the blue due to the proportion of magnesium. Finally the spectal sensitivity range in detection would also be modified and adjustable due to the proportion of magnesium.

However, this research led to a certain number of difficulties which misled the expert.

The preparation of MgZnTe required more precautions due to the very considerable reactivity of the magnesium.

The electrical contacts on MgZnTe are less ohmic due to the much wider band gap.

In low temperature photoluminescence the lines emitted by MgZnTe are wider than those of ZnTe making impossible a fine analysis of the nature of the electronic transitions.

The fundamental phenomena appearing in ZnTe are already very complex and the incorporation of magnesium adds a supplementary degree of complexity, particularly with regard to the native defect.

Finally and more particularly the MgZnTe compound obtained by conventional metallurgical processes is highly insulating making it impossible to inject the electrons permitting the electroluminescence of a diode.

The research carried out by the inventors has shown that it was possible to make MgZnTe sufficiently conductive to ensure the operation of a diode, that the crystalline quality of the material was not impaired, and that the application of ion implantation to this substrate led to an electroluminescent and/or photodetective structure being obtained.

More specifically the present invention relates to a method for the manufacture of light emitting and/or photodetective diodes, wherein it comprises the following operations:

(a) starting with a substrate of the material $Mg_xZn_{1-x}Te$;

(b) a means which will make this material conductive is applied thereto;

(c) a layer of thickness $x_j$ is applied to the surface of this substrate and which is compensated in such a way that it has a high resistivity;

(d) ions are implanted with a sufficient energy to create a trapping zone of thickness $x_1$ in the semiconductor surface and above it an insulating zone of thickness $x_2$ with $x_1 < x_j$;

(e) conductive contacts are formed on the substrate surface and on its second face.

According to a preferred embodiment of the invention the operation which makes the material $Mg_xZn_{1-x}Te$ conductive is carried out by incorporating a doping element, preferably an alkali metal, e.g. potassium. This incorporation can be carried out during the manufacture of the material or by diffusion into the existing material. It is preferably completed by annealing under a zinc atmosphere.

The compensated layer is for example obtained by thermal diffusion of the material constituting a conductive surface layer which also serves to form one of the conductor contacts, said material being advantageously aluminium.

The method of the invention is applied to a substrate of $Mg_xZn_{1-x}Te$ of type p when it is intended to produce diodes which are both electroluminescent and photodetective.

The invention also relates to a semiconductor material of high crystalline quality and from which it is possible to produce light emitting and/or photodetective diodes.

According to the invention this material is in accordance with the formula $Mg_xZn_{1-x}Te$ in which x is below 0.15.

Preferably and more specifically in the application to light emitting and/or photodetective diodes this material also contains a doping impurity such as potassium or any other alkali (lithium, sodium, etc.).

DETAILED DESCRIPTION OF PREFERRED EMBODIMENTS

Hereinafter a number of exemplified and non-limitative embodiments are given of light emitting and/or photodetective diodes according to the present invention.

Into an internally graphited quartz flask of diameter 23 mm is introduced a charge formed from 193.81 grams of tellurium, 65.37 grams of zinc and 3.05 grams of magnesium corresponding to the composition $Zn_{0.378}Mg_{0.047}Te_{0.575}$ leading to a crystal $Mg_xZn_{1-x}Te$ in which x=0.094. To this is added 26 mg of potassium telluride $K_2Te$ in such a way as to obtain a 100 p.p.m. atomic potassium doping.

The flask is sealed under argon vacuum and introduced into an oven such as described in French Pat. No. 75 35997 of Nov. 26, 1975. It is heated to a temperature such that the charge is internally liquid, i.e. at a temperature above 1160° C. It is then slowly moved at a speed between 0.1 and 0.3 mm per hour in such a way as to obtain a unidirectional crystallisation.

Plates are cut from this monocrystal and annealed at 750° C. under a zinc atmosphere for one hour. The crystal obtained has a type p conductivity and the concentration of free carriers is $10^{17}$ vacant sites per $cm^3$.

The method described in French patent application EN No. 78 08522 of Mar. 23, 1978 is applied to this crystal. However, the parameters are adapted to the substrate $Mg_xZn_{1-x}Te$ which, due to its better crystalline quality, has a much greater diffusibility.

Onto the upper face of a plate is deposited a 2,000 Å aluminium coating which serves as the upper electrical contact, said coating being engraved in such a way as to delimit the elementary diodes. The thus coated plate is heated to 400° C. for 20 minutes to create a diffused zone. The plate is then subject to implantation of boron ions through the aluminium layer, the implantation energy of 57 KeV and the layer thickness of 2,000 Å are such that the majority of the crystalline defects due to the implantation are located therein, as described in French Pat. No. 74 27556 of Aug. 6, 1974. Finally a contact layer is deposited in conventional manner on the opposite face of the plate.

The diode obtained emits light at the wavelength of 5380 Å, i.e. in green colour. Compared with a diode produced under corresponding conditions in ZnTe it has an identical operating voltage (threshold between 5 and 6 V), has the same conversion efficiency, supplies a current when it receives energy radiation at above 2.32 eV, but there are no black lines and there is no limitation to its life. Its operation in emission is the same as that described on page 7, line 14 to page 8, line 32 of French patent application EN No. 78 08522 of March 23rd 1978 and these paragraphs are included in the present description.

Other diodes have been produced according to the same method and with the same parameters, except for the value of x. For x=0.106 a diode emitting at a wavelength of 5360 Å has been obtained and for x=0.014 a diode emitting at a wavelength of 5510 Å has been obtained, all the other properties being retained.

The diodes obtained by the method of the invention can be applied more particularly to the construction of a screen for the visual display and/or reading of data constituted by a matrix of such diodes and equivalent to the screen of a cathode ray tube, and/or a picture tube respectively. In a same matrix configuration they can also be applied to the construction of a system for the writing and/or reading of documents by projecting onto photosensitive paper the image of each diode and/or by projection onto the matrix of a document to be read.

The invention is not limited to the embodiments described and represented hereinbefore and various modifications can be made thereto without passing beyond the scope of the invention.

What is claimed is:

1. A method for manufacture of light emitting and/or photodetective diodes, comprising
   (a) providing a semiconductor $Mg_xZN_{1-x}Te$ substrate,
   (b) treating the substrate to incorporate a doping element therein,
   (c) applying a layer of conductive material to the substrate and treating the applied layer to create a compensated layer having high resistivity in the substrate,
   (d) implanting ions on a first fact of the compensated semiconductor substrate with sufficient energy to create two zones therein, a trapping zone in the semiconductor surface having a thickness less than said layer of high resistivity material, and an insulating zone above said trapping zone,
   (e) forming conductive contacts on a second face of the substrate.

2. A method according to claim 1 wherein treatment of the substrate to make it conductive includes incorporating a doping element in the $Mg_xZn_{1-x}Te$ material.

3. A method according to claim 2 wherein the doping element is included in the $Mg_xZN_{1-x}Te$ material during formation of the semiconductor substrate.

4. A method according to claim 1 wherein at step "c" the compensated layer is created by thermally diffusing the applied layer into the substrate.

5. A method according to claim 2 wherein the doping element is included in the $Mg_xZN_{1-x}Te$ material by coating the semiconductor substrate with a doping element and annealing the coated substrate so as to cause diffusion of the doping element into the substrate material.

6. A method according to claim 4 wherein said layer of high resistivity material constitutes the surface conductor contact.

7. A method according to claim 5 wherein the annealing is carried out in a zinc atmosphere.

8. A method accoring to claims 2, 3, 5 or 7 wherein the doping element is an alkali metal.

9. A method according to claim 8 wherein the doping element is potassium.

10. A method according to claims 4 or 6 wherein the high resistivity layer is of aluminum.

11. A method according to claims 1, 2, 3, 5, 7, 4 or 6 wherein x is below 0.15 in the magnesium containing composition $Mg_xZn_{1-x}Te$.

* * * * *